United States Patent
Pao

(10) Patent No.: US 10,789,995 B2
(45) Date of Patent: Sep. 29, 2020

(54) DATA STORAGE SYSTEM AND OPERATING METHOD FOR NON-VOLATILE MEMORY

(71) Applicant: Silicon Motion, Inc., Jhubei (TW)

(72) Inventor: Yi-Hua Pao, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 16/263,803

(22) Filed: Jan. 31, 2019

(65) Prior Publication Data

US 2019/0348083 A1 Nov. 14, 2019

(30) Foreign Application Priority Data

May 14, 2018 (TW) .............................. 107116288 A

(51) Int. Cl.
| | |
|---|---|
| G11C 7/04 | (2006.01) |
| G11C 16/28 | (2006.01) |
| G11C 11/4072 | (2006.01) |
| G11C 7/22 | (2006.01) |

(52) U.S. Cl.
CPC ............... *G11C 7/04* (2013.01); *G11C 7/22* (2013.01); *G11C 11/4072* (2013.01); *G11C 16/28* (2013.01)

(58) Field of Classification Search
CPC ......... G11C 7/04; G11C 7/22; G11C 11/4072; G11C 16/28
See application file for complete search history.

(56) References Cited

U.S. PATENT DOCUMENTS

| | | | |
|---|---|---|---|
| 7,742,353 B2 * | 6/2010 | Chen ..................... | G11C 7/04 |
| | | | 365/196 |
| 8,380,942 B1 | 2/2013 | Corddry et al. | |
| 9,165,668 B1 * | 10/2015 | Zhao .................. | G11C 16/3418 |
| 9,405,356 B1 * | 8/2016 | Sareen ................. | G06F 1/3268 |
| 9,668,337 B2 * | 5/2017 | Stoev .................. | G11B 5/09 |
| 2012/0224425 A1 | 9/2012 | Fai et al. | |
| 2014/0082255 A1 | 3/2014 | Powell | |
| 2014/0233132 A1 | 8/2014 | Budiman et al. | |
| 2015/0043281 A1 | 2/2015 | Hemink et al. | |
| 2015/0046637 A1 | 2/2015 | Chien et al. | |
| 2015/0301932 A1 | 10/2015 | Oh | |
| 2016/0239235 A1 | 8/2016 | Chung | |
| 2017/0071056 A1 | 3/2017 | Stoev et al. | |
| 2018/0046231 A1 | 2/2018 | Raghu et al. | |

FOREIGN PATENT DOCUMENTS

| | | |
|---|---|---|
| JP | 2012-194897 A | 10/2012 |
| JP | 2014-509769 A | 4/2014 |
| JP | 2014-160527 A | 9/2014 |

(Continued)

*Primary Examiner* — Pho M Luu
(74) *Attorney, Agent, or Firm* — Wang Law Firm, Inc.

(57) ABSTRACT

A preheating procedure for a non-volatile memory that can be used in a wide range of ambient temperatures is shown. The controller of the non-volatile memory operates the non-volatile memory to preheat the non-volatile to a temperature target. The controller avoids writing valid data to the non-volatile memory until preheating the non-volatile memory to the temperature target. The controller may write or read dummy data to or from the non-volatile memory until preheating the non-volatile memory to the temperature target.

18 Claims, 5 Drawing Sheets

(56) References Cited

FOREIGN PATENT DOCUMENTS

| JP | 2015-032317 A | 2/2015 |
| JP | 2017-216785 A | 12/2017 |
| JP | 2018-055759 A | 4/2018 |
| TW | 200917269 A | 4/2009 |
| TW | 201528122 A | 7/2015 |

\* cited by examiner

DATA STORAGE SYSTEM AND OPERATING METHOD FOR NON-VOLATILE MEMORY

CROSS REFERENCE TO RELATED APPLICATIONS

This Application claims priority of Taiwan Patent Application No. 107116288, filed on May 14, 2018, the entirety of which is incorporated by reference herein.

BACKGROUND OF THE INVENTION

Field of the Invention

The present invention relates to data storage devices and methods for operating non-volatile memory.

Description of the Related Art

There are various forms of non-volatile memory (NVM) for long-term data retention, such as flash memory, magnetoresistive RAM, ferroelectric RAM, resistive RAM, spin transfer torque-RAM (STT-RAM), and so on.

The reliability of non-volatile data may be affected by ambient temperature. Taking vehicle electronics as an example, an in-vehicle computer may be used in weather and temperature conditions that vary drastically. When the air conditioner is not turned on, the temperature may be as low as minus 40 degrees Celsius, or as high as 85 degrees Celsius. Such a large temperature difference will greatly affect the reliability of data storage. For example, data that has been written at a low temperature may not be read correctly (high-temperature reading is particularly prone to errors).

In addition to vehicle electronics, non-volatile memory has many other applications that face the problems of environmental temperature differences which may affect the reliability of the data.

BRIEF SUMMARY OF THE INVENTION

The present disclosure discloses a non-volatile memory preheating technique to deal with the drastic variability of ambient temperatures.

A data storage system in accordance with an exemplary embodiment of the disclosure includes a non-volatile memory and a controller. The controller operates the non-volatile memory to preheat the non-volatile memory to a temperature target. The controller avoids writing valid data to the non-volatile memory until preheating the non-volatile memory to the temperature target.

In an exemplary embodiment, the controller writes dummy data to the non-volatile memory until preheating the non-volatile memory to the temperature target. In an exemplary embodiment, the controller reads the non-volatile memory and regards read data as dummy data until preheating the non-volatile memory to the temperature target.

In an exemplary embodiment, the controller overclocks to accelerate the non-volatile memory and thereby preheats the non-volatile memory to the temperature target. In an exemplary embodiment, the controller increases the transmission rate of the non-volatile memory to accelerate the non-volatile memory and thereby preheats the non-volatile memory to the temperature target. In an exemplary embodiment, the data storage system includes an on-die termination (ODT). The controller turns on the on-die termination and thereby preheats the non-volatile memory to the temperature target.

In an exemplary embodiment, the data storage system includes an active heat dissipation device. The controller turns off the active heat dissipation device and thereby preheats the non-volatile memory to the temperature target.

In an exemplary embodiment, the data storage system includes a thermometer. The controller gets the current temperature from the thermometer, and has historical programming temperature in record. The historical programming temperature is an average of the programming temperatures of a target block of the non-volatile memory, or the detected temperature of the last programming on the target block. When the data storage system is powered on, the controller determines whether the difference between the current temperature and the historical programming temperature is greater than a threshold. When the difference is greater than the threshold, the controller operates the non-volatile memory to preheat the non-volatile memory to the temperature target.

In another exemplary embodiment, the controller gets the current temperature from the thermometer. When the data storage system is powered on, the controller determines whether the current temperature is within a normal range. When the current temperature is not within the normal range, the controller operates the non-volatile memory to preheat the non-volatile memory to the temperature target.

In an exemplary embodiment, the controller and the non-volatile memory are packaged in a multiple-chip package (MCP). Due to the MCP design, it is easy to preheat the non-volatile memory by operating the non-volatile memory.

In another exemplary embodiment, an operating method for non-volatile memory includes the following steps: operating a non-volatile memory to preheat the non-volatile memory to a temperature target; and avoiding writing valid data to the non-volatile memory until preheating the non-volatile memory to the temperature target.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

A non-volatile memory for long-term data retention may be a flash memory, a magnetoresistive RAM, a ferroelectric RAM, a resistive RAM, a spin transfer torque-RAM (STT-RAM) and so on. A non-volatile memory may be used to implement a data storage device or a data center. The following discussion uses flash memory as an example.

Flash memory is often used as a storage medium in today's data storage devices. Flash memory is often implemented in memory cards, USB flash devices, SSDs, and so on. In another exemplary embodiment, a flash memory may be packaged with a controller to form a multiple-chip package named eMMC.

A data storage device using a flash memory as a storage medium can be applied in a variety of electronic devices, including a smartphone, a wearable device, a tablet computer, a virtual reality device, etc. A calculation module of an electronic device may be regarded as a host that operates a data storage device equipped on the electronic device to access a flash memory within the data storage device.

A data center may be built with data storage devices using flash memories as the storage medium. For example, a server may operate an array of SSDs to form a data center. The server may be regarded as a host that operates the SSDs to access the flash memories within the SSDs.

In the following paragraphs, vehicle electronics (or an in-vehicle computer) are discussed especially for the problems due to ambient temperature variations. The present invention is not intended to be limited to vehicle electronics. In today's extreme climate, data storage devices for various applications may face considerable ambient temperature variations and require the design of the invention.

Figure 1:
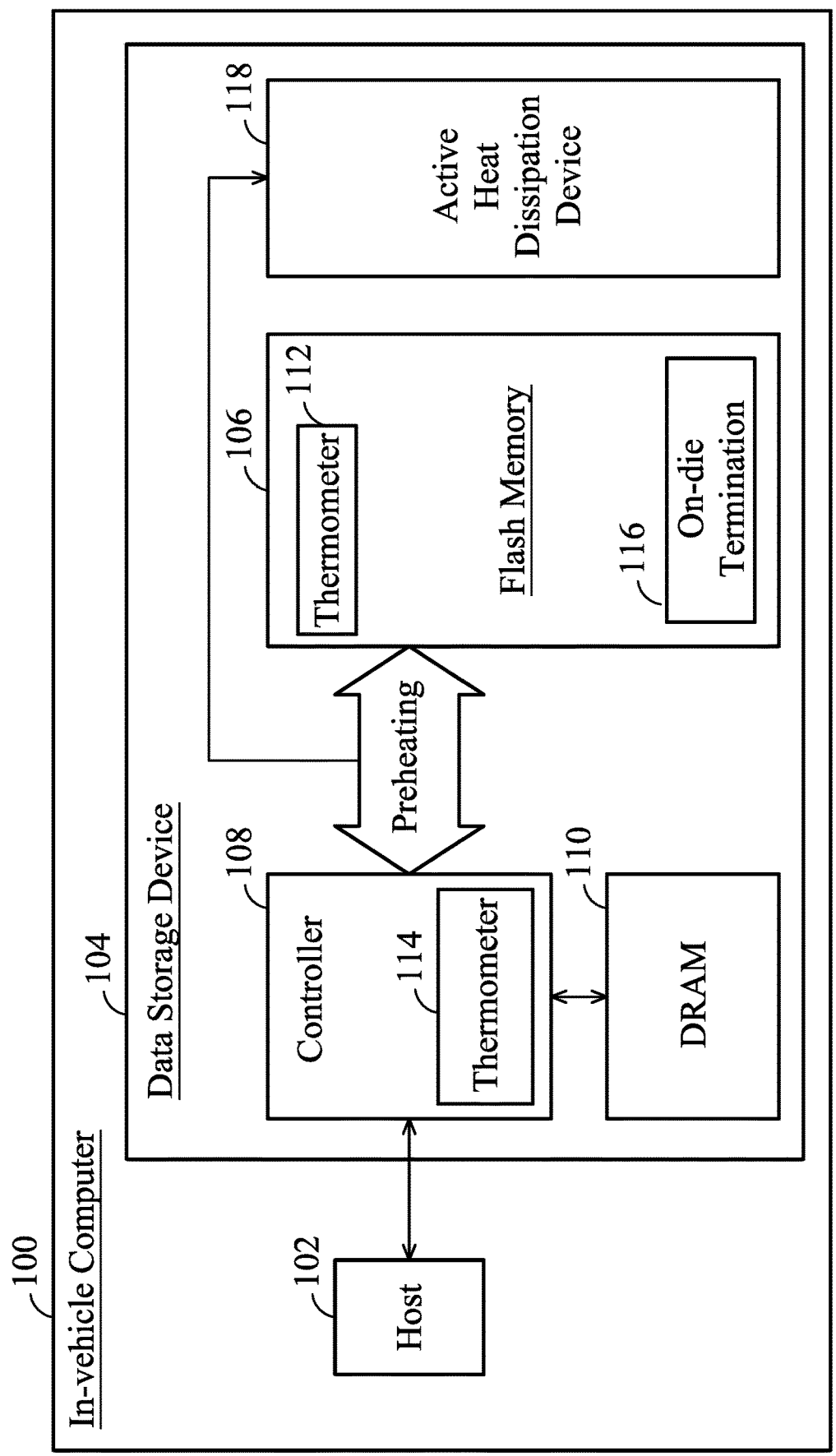
FIG. 1 illustrates an in-vehicle computer 100 implemented in accordance with an embodiment of the present invention, including a host 102 and a data storage device 104.

FIG. 1 illustrates an in-vehicle computer 100 implemented in accordance with an embodiment of the present invention, including a host 102 and a data storage device 104. The data storage device 104 uses a flash memory 106 as a non-volatile storage medium and provides a controller 108 to operate the flash memory 106 in accordance with commands from the host 102. The illustrated data storage device 104 has a dynamic random access memory (DRAM) 110 which is used by the controller 108 when controlling the flash memory 106. In other exemplary embodiments, the DRAM 110 can be replaced with other volatile storage media, such as a static random access memory (SRAM). In one exemplary embodiment, the data storage device 104 is a Multi-Chip Package (MCP) with the flash memory 106, the controller 108, and the dynamic random access memory (DRAM) 110 being packaged together. The DRAM 110 is not limited to being fabricated inside the multi-chip package and may be externally connected.

The controller 108 of the present invention performs a preheating operation on the flash memory 106 to ensure the data reliability of the flash memory 106. Writing data to the flash memory 106 at an extremely low temperature is avoided.

Referring to FIG. 1, the flash memory 106 has a thermometer 112 and the controller 108 has a thermometer 114. Either thermometer 112 or thermometer 114 is used by the controller 108 to implement the preheating operation of the present invention. Based on the temperature detected by the thermometer 112 or 114, the controller 108 may activate or terminate the preheating of the data storage medium.

A variety of dummy operations can be applied to achieve the purpose of preheating, including writing dummy data (rather than valid data) to the flash memory 106, or meaningless reading of the flash memory 106 (e.g., treating the read data as dummy data or directly discard the read data). In order to accelerate the preheating, the controller 108 may operate at the higher operating frequency. The controller 108 operating at the higher operating frequency may also switch the flash memory 106 to operate at the higher operating frequency. For example, the controller 108 may switch the flash memory 106 from a DDR mode to a DDR2 mode, or switch the flash memory 106 from an SDR mode to a DDR mode. If the data storage device 104 has an active heat dissipation device 118, such as a fan, the preheating may be achieved by stopping the active heat dissipation device 118. The flash memory 106 shown in FIG. 1 includes an on-die termination 116, which is turned on when the flash memory 106 is switched from the DDR mode to the DDR2 mode to cope with electromagnetic interference (Glitch). When the on-chip termination 116 is turned on, heat may be generated due to power consuming. The controller 108, therefore, may achieve the preheating by conducting the on-chip termination 116.

Figure 2A:
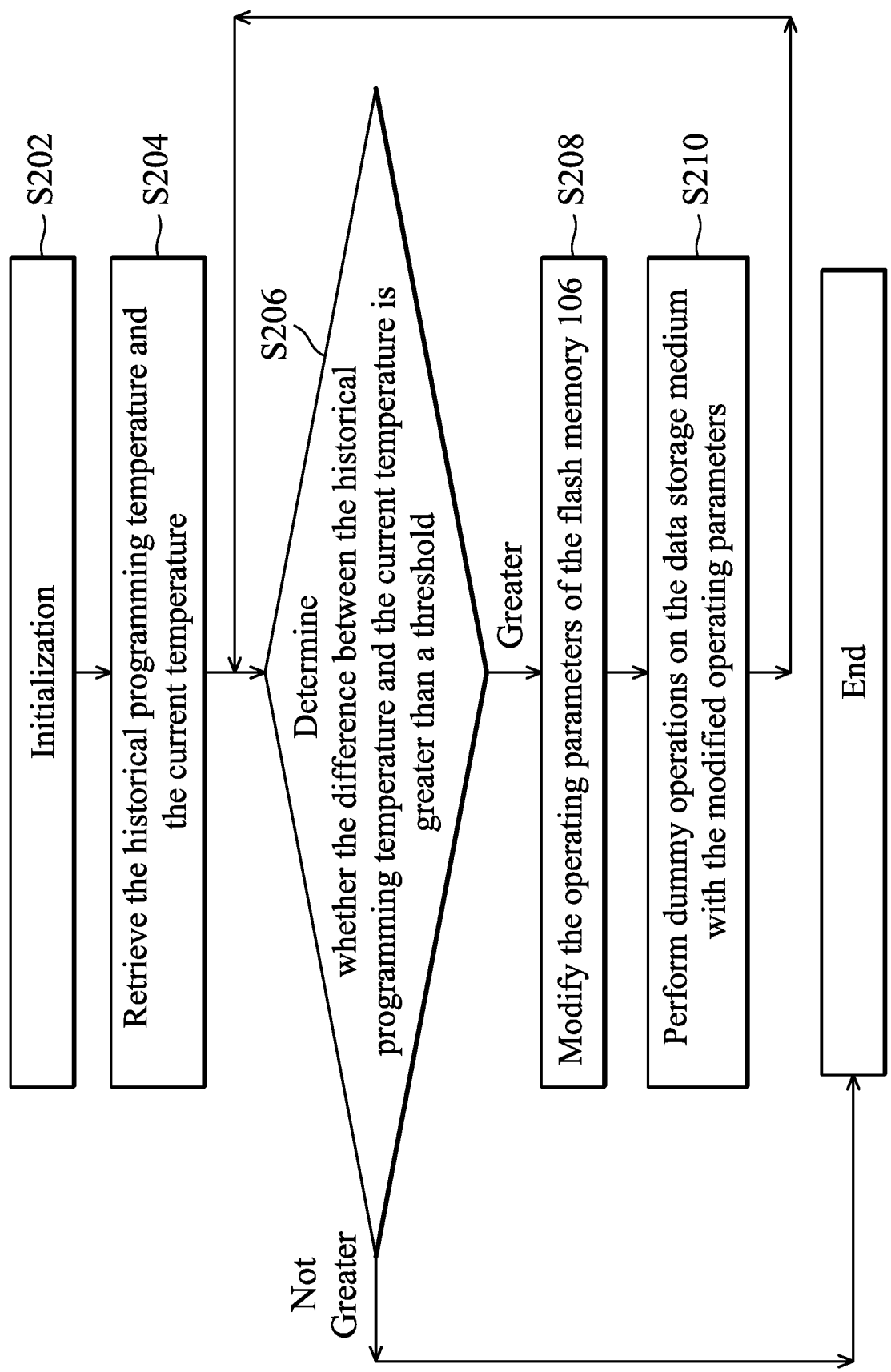
FIG. 2A is a flowchart of a method for preheating a data storage medium according to an exemplary embodiment of the present invention, wherein the controller 108 may preheat the flash memory 106 according to the data storage medium preheating method.

FIG. 2A is a flowchart of a method for preheating a data storage medium according to an exemplary embodiment of the present invention. The controller 108 may preheat the flash memory 106 according to the data storage medium preheating method.

When the in-vehicle computer 100 is powered on, the data storage device 104 starts an initialization procedure (step S202) to enable the controller 108, the flash memory 106, and the thermometer 112 or 114. The DRAM 110 may be also enabled during the initialization procedure.

In step S204, the controller 108 retrieves the historical programming temperature and the current temperature. The historical programming temperature may be the average programming temperature of a target block of the flash memory 106, or the detected temperature of the last programming on the target block. The average temperature or the final temperature may be recorded at the end of the target block as the EOB (end of block) information. In another exemplary embodiment, the average temperature or the final temperature may be recorded in a spare area of the target block. The current temperature and the historical programming temperature are preferably sensed by the thermometer 112 or 114. The target block may be the block that the controller 108 currently wants to access. The target block may be allocated for the storage of system information, or programmed in an SLC (single level cell) mode, or having the EOB information stored therein.

In step S206, the controller 108 determines whether the difference between the historical programming temperature and the current temperature is greater than a threshold. When the historical programming temperature is 80 degrees Celsius, the current temperature is minus 40 degrees Celsius, and the threshold is set to 100, the controller 108 determines that the difference between the historical programming temperature and the current temperature is 120, which is greater than the threshold and, therefore, step S208 is performed. When the controller 108 determines that the difference between the historical programming temperature and the current temperature is not greater than the threshold, the preheating procedure for the data storage medium ends.

In step S208, the controller 108 modifies the operating parameters of the flash memory 106. For example, the operating frequency of the flash memory 106 may be promoted from DDR 200 to DDR 400. In another exemplary embodiment, the controller 108 may modify its own operating parameters. For example, the operating frequency of the controller 108 may be promoted from 375M Hz to 525M Hz. In another exemplary embodiment, the controller 108 may modify the operating parameters of the DRAM 110. For example, the operating frequency of the DRAM 110 may be promoted from DDR 200 to DDR 400. When the flash memory 106 and the peripheral components operate at the higher operating frequencies, more energy is consumed which results in a higher temperature. In another exemplary embodiment, the controller 108 may turn off or otherwise disable the active heat dissipation device 118 to achieve the preheating of the present invention.

In step S210, the controller 108 performs dummy operations on the data storage medium with the modified operating parameters. The controller 108 may write dummy data to the flash memory 106, or reads a large amount of data (meaningless reading) from the flash memory 106, or repeatedly reads data from a target block. By performing the dummy operations, the temperature of the flash memory 106 and the peripheral components (such as the controller 108 and the DRAM 110) increases. The increased temperature is detected by the thermometer 112 or 114. For example, the temperature detected by the thermometer 112 or 114 may be raised from minus 40 degrees Celsius to minus 20 degrees Celsius. The determination of step S206 is no longer satisfied, and the controller 108 ends the preheating of the data storage medium. The controller 108 restores the operating parameters of the flash memory 106, the controller 108 and the DRAM 110 to operate the flash memory 106 in a normal (preset) mode for normal operations.

When operating the flash memory 106 in the normal mode, the operating parameters adopted by the controller 118 may be specially set to operate the flash memory 106 at a lower access rate (e.g. SDR) for firmware retrieving. After retrieving the firmware, the controller 108 may modify the operating parameters to operate the flash memory 106 at a higher access rate (e.g., DDR). The modified operating parameters may equal to the operating parameters used in step S208 (e.g. DDR2), or be lower than the operating parameters used in step S208 (for example, being modified to DDR which is slower than DDR2).

Figure 2B:
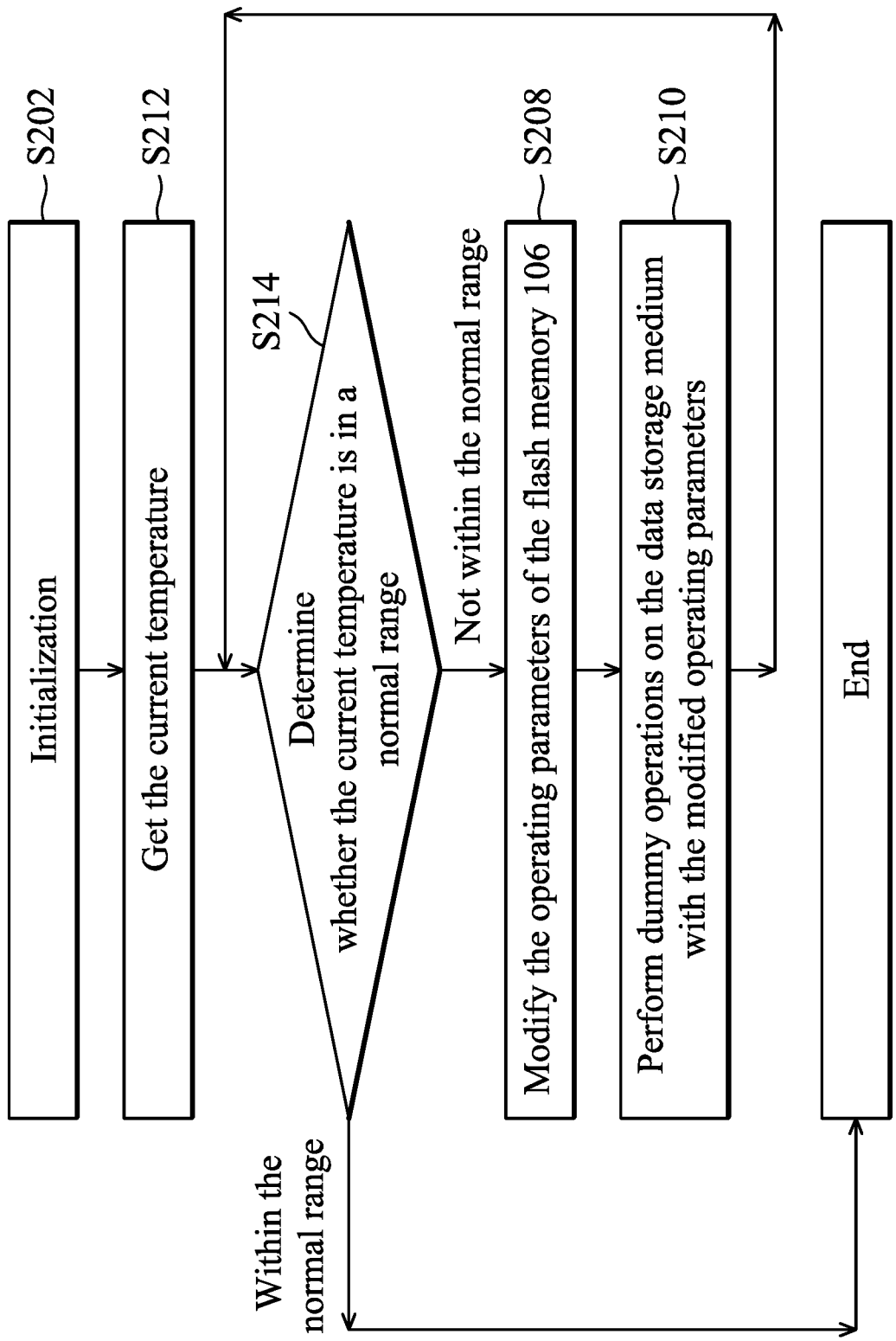
FIG. 2B is a flowchart of a method for preheating a data storage medium in accordance with another exemplary embodiment of the present invention.

FIG. 2B is a flowchart of a method for preheating a data storage medium in accordance with another exemplary embodiment of the present invention. This exemplary embodiment has some steps the same as those of the previous exemplary embodiment, including steps S202, S208 and S210. Only the different steps S212 and S214 are described below.

In step S212, the controller 108 gets the current temperature that is preferably detected by the thermometer 112 or 114.

In step S214, the controller 108 determines whether the current temperature is in a normal range. When the current temperature is minus 40 degrees Celsius and the normal range is from minus 20 degrees Celsius to 80 degrees Celsius (considering the general temperature 25 degrees Celsius), it is determined that the current temperature is not in the normal range. Thus, steps S208 and S210 are performed for preheating. The thermometer 112 or 114 then detects the increased temperature.

Figure 3:
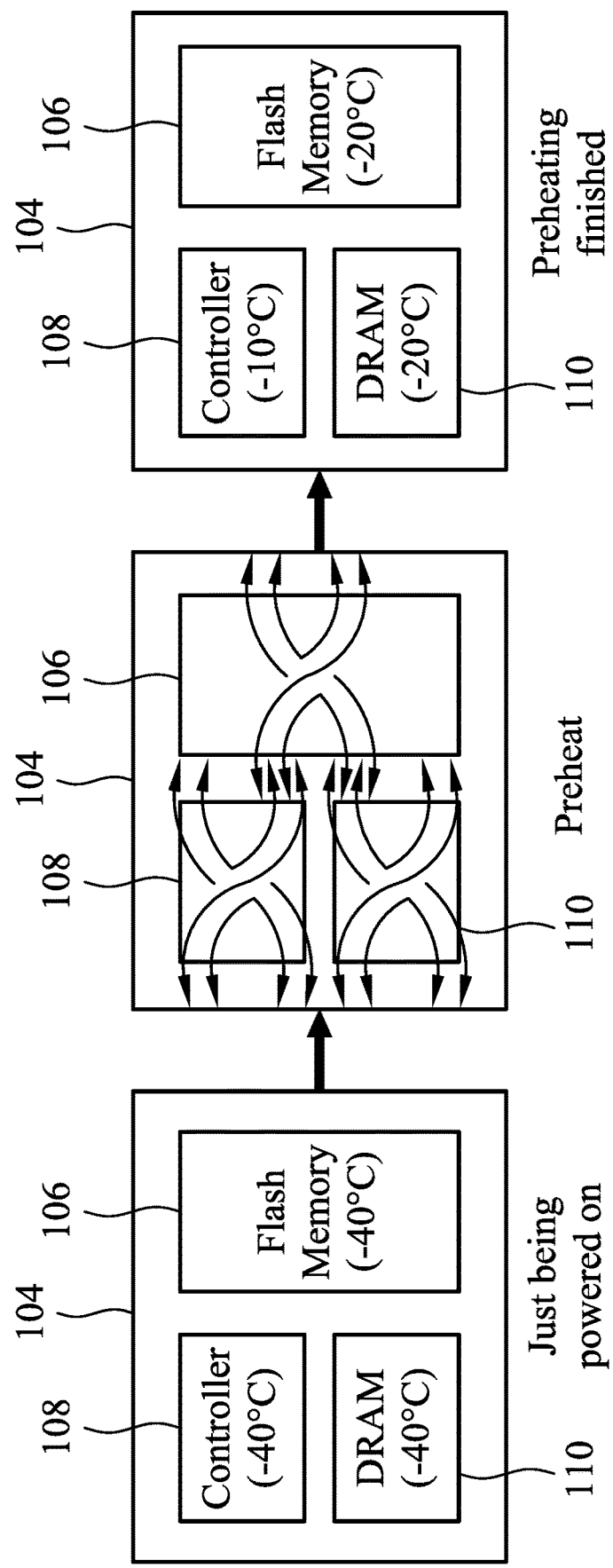
FIG. 3 illustrates the temperature variations of the components of an MCP data storage device 104.

The preheating technology of the present invention has a particularly significant effect in the application of Multi-Chip Package (MCP). FIG. 3 illustrates the temperature variations of the components of an MCP data storage device 104. At the time of powering-on, the flash memory 106, the controller 108, and the dynamic random access memory 110 are at an extremely low temperature, minus 40 degrees Celsius. For example, in a snowy environment, the temperature inside the car may be so low when the vehicle is not started. According to the preheating method for the data storage medium, the flash memory 106, the controller 108 and the dynamic random access memory 110 all generate thermal energy and thereby the preheating effect is achieved. The preheating can significantly speed up in a multi-chip package. Due to the preheating, the temperature of the components within the data storage device 104 is raised. As shown, the flash memory 106 is heated from minus 40 degrees Celsius to minus 20 degrees Celsius, and the controller 108 is heated from minus 40 degrees Celsius to minus 10 degrees Celsius, and the dynamic random access memory 110 is heated from minus 40 degrees Celsius to minus 20 degrees Celsius. Taking the vehicle electronics in a snowy environment as an example, even if the air conditioner on the vehicle is not fully functioning, the data storage device 104 of the in-vehicle computer 100 can work normally due to the preheating method for the data storage medium. Because of the preheating design of the present invention, the operations of the data storage device 104 do not depend on the air conditioner.

Figure 4:
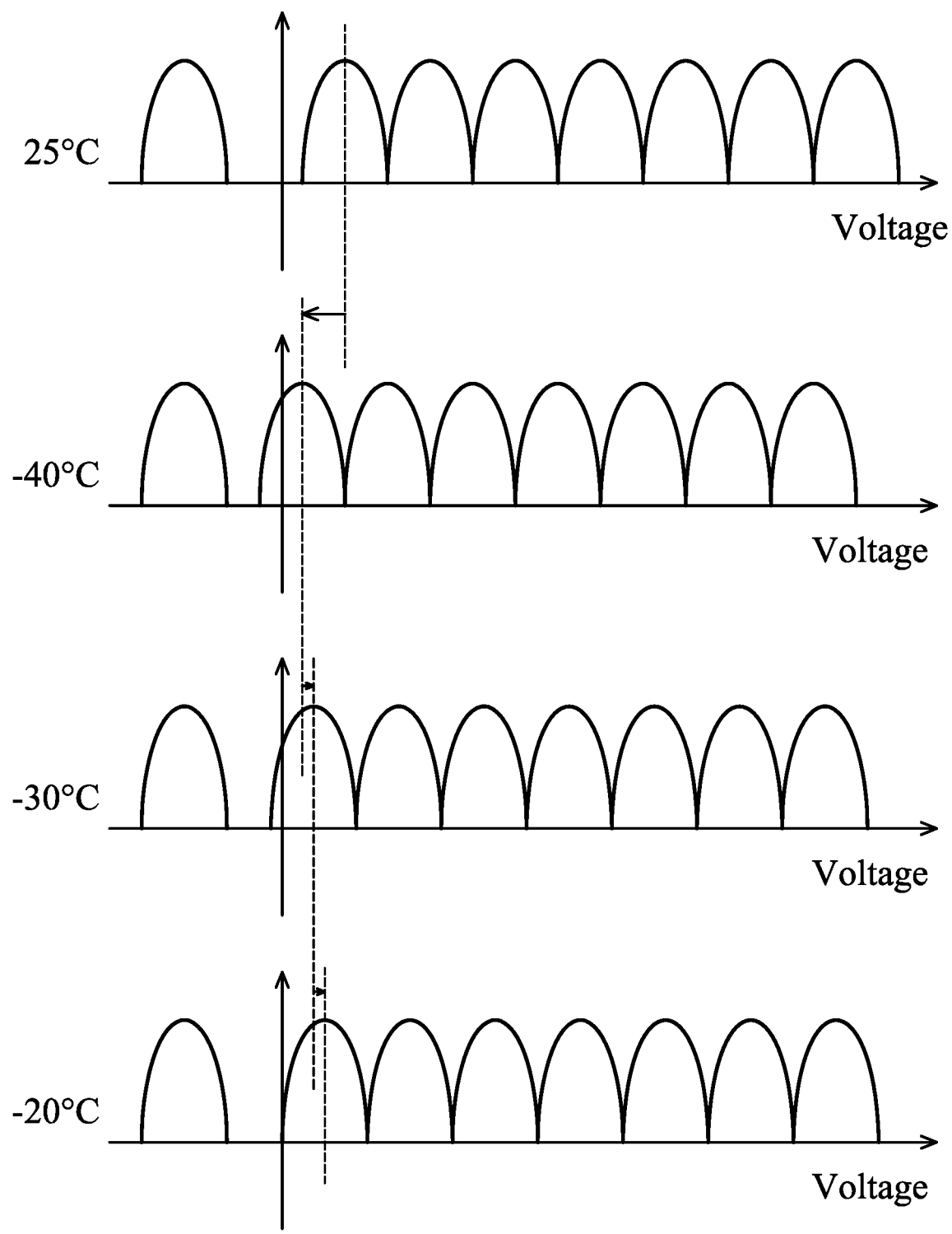
FIG. 4 shows voltage distribution probability, corresponding to the different temperatures (25 degrees Celsius, minus 40 degrees Celsius, minus 30 degrees Celsius, and minus 20 degrees Celsius), of triple level cells (TLCs) at different digital representations, wherein the threshold voltages (Vth) for identifying the digital representation of TLCs can be obtained from FIG. 4.

Corresponding to the different temperatures (25 degrees Celsius, minus 40 degrees Celsius, minus 30 degrees Celsius, and minus 20 degrees Celsius), FIG. 4 shows voltage distribution probability of triple level cells (TLCs) at different digital representations. The threshold voltages (Vth) for identifying the digital representation of the TLCs can be obtained from FIG. 4. The following description is made corresponding to FIG. 3. When power has just been turned on, the flash memory 106 is at minus 40 degrees Celsius. Compared with a distribution probability of 25 degrees Celsius, the TLCs at minus 40 degree Celsius correspond to threshold voltages (Vth) which are obviously shifted to the left, and are in danger of falling into an unrecognizable area. The flash memory 106 is warmed up to minus 30 degrees Celsius by the pre-heating operation. Compared with the distribution probability of minus 40 degrees Celsius, the TLCs at minus 30 degree Celsius correspond to threshold voltages (Vth) which are slightly modified, and the right shift causes fewer chances of falling into an unrecognizable area. After reaching the preheating target (minus 20 degrees Celsius), the threshold voltages (Vth) for the TLCs are shifted to the right again, successfully avoiding falling into an unrecognizable area. The preheating technology of the present invention significantly improves the reliability of the data stored in the flash memory 106.

Any techniques in which the controller 108 performs dummy operations on the flash memory 106 to achieve the purpose of preheating belong to the scope of the present invention. While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage system, comprising:
a non-volatile memory;
a thermometer; and
a controller,
wherein:
the controller is configured to get current temperature from the thermometer and has historical programming temperature in record;
the historical programming temperature is an average of programming temperature of a target block of the non-volatile memory, or a detected temperature of the last programming on the target block;
when the data storage system is powered on, the controller determines whether a difference between the current temperature and the historical programming temperature is greater than a threshold;
when the difference is greater than the threshold, the controller operates the non-volatile memory to preheat the non-volatile memory to a temperature target; and
the controller avoids writing valid data to the non-volatile memory until preheating the non-volatile memory to the temperature target.

2. The data storage system as claimed in claim 1, wherein:
the controller writes dummy data to the non-volatile memory until preheating the non-volatile memory to the temperature target.

3. The data storage system as claimed in claim 1, wherein:
the controller reads the non-volatile memory and regards read data as dummy data until preheating the non-volatile memory to the temperature target.

4. The data storage system as claimed in claim 1, wherein:
the controller overclocks to accelerate the non-volatile memory and thereby preheats the non-volatile memory to the temperature target.

5. The data storage system as claimed in claim 1, wherein:
the controller increases a transmission rate of the non-volatile memory to accelerate the non-volatile memory and thereby preheats the non-volatile memory to the temperature target.

6. The data storage system as claimed in claim 1, further comprising:
an on-die termination,
wherein the controller turns on the on-die termination and thereby preheats the non-volatile memory to the temperature target.

7. The data storage system as claimed in claim 1, further comprising:
an active heat dissipation device,
wherein the controller turns off the active heat dissipation device and thereby preheats the non-volatile memory to the temperature target.

8. The data storage system as claimed in claim 1, wherein:
when the data storage system is powered on, the controller further determines whether the current temperature is within a normal range;
when the current temperature is not within the normal range, the controller operates the non-volatile memory to preheat the non-volatile memory to the temperature target.

9. The data storage system as claimed in claim 1, wherein:
the controller and the non-volatile memory are packaged in a multiple-chip package.

10. An operating method for non-volatile memory, comprising:
getting current temperature from a thermometer and having historical programming temperature in record, wherein the historical programming temperature is an average of programming temperature of a target block of a non-volatile memory, or a detected temperature of the last programming on the target block;
when a data storage system containing the non-volatile memory is powered on, determining whether a difference between the current temperature and the historical programming temperature is greater than a threshold; and
when the difference is greater than the threshold, operating the non-volatile memory to preheat the non-volatile memory to a temperature target,
avoiding writing valid data to the non-volatile memory until preheating the non-volatile memory to the temperature target.

11. The operating method as claimed in claim 10, further comprising:
writing dummy data to the non-volatile memory until preheating the non-volatile memory to the temperature target.

12. The operating method as claimed in claim 10, further comprising:
reading the non-volatile memory and regarding read data as dummy data until preheating the non-volatile memory to the temperature target.

13. The operating method as claimed in claim 10, further comprising:
overclocking a controller that operates the non-volatile memory to accelerate the non-volatile memory and thereby preheats the non-volatile memory to the temperature target.

14. The operating method as claimed in claim 10, further comprising:
increasing a transmission rate of the non-volatile memory to accelerate the non-volatile memory and thereby preheating the non-volatile memory to the temperature target.

15. The operating method as claimed in claim 10, further comprising:
coupling the non-volatile memory to an on-die termination; and
turning on the on-die termination and thereby preheating the non-volatile memory to the temperature target.

16. The operating method as claimed in claim 10, further comprising:
turning off an active heat dissipation device and thereby preheating the non-volatile memory to the temperature target.

17. The operating method as claimed in claim 10, further comprising:
when the data storage system is powered on, further determining whether the current temperature is within a normal range; and
when the current temperature is not within the normal range, operating the non-volatile memory to preheat the non-volatile memory to the temperature target.

18. The operating method as claimed in claim 10, wherein:
the non-volatile memory and a controller that operates the non-volatile memory are packaged in a multiple-chip package.

* * * * *